(12) United States Patent
Pinneo

(10) Patent No.: US 6,815,052 B2
(45) Date of Patent: Nov. 9, 2004

(54) FILLED DIAMOND FOAM MATERIAL AND METHOD FOR FORMING SAME

(75) Inventor: John M. Pinneo, Portola Valley, CA (US)

(73) Assignee: P1 Diamond, Inc., Santa Clara, CA (US)

( * ) Notice: Subject to any disclaimer, the term of this patent is extended or adjusted under 35 U.S.C. 154(b) by 0 days.

(21) Appl. No.: 09/728,942

(22) Filed: Dec. 1, 2000

(65) Prior Publication Data
US 2003/0211306 A1 Nov. 13, 2003

(51) Int. Cl.[7] .................................................. B32B 3/26
(52) U.S. Cl. .................... 428/319.1; 428/307.3; 428/307.7; 428/312.2; 428/314.2; 428/318.4; 428/336; 428/408
(58) Field of Search ................................. 428/406, 332, 428/469, 472, 701, 304.4, 307.3, 307.7, 312.2, 314.2, 318.4, 319.1, 408, 336

(56) References Cited

U.S. PATENT DOCUMENTS

| | | | |
|---|---|---|---|
| 4,268,276 A | | 5/1981 | Bovenkerk .................... 51/295 |
| 4,731,296 A | * | 3/1988 | Kikuchi et al. |
| 4,738,689 A | | 4/1988 | Gigl et al. ..................... 51/295 |
| 4,850,523 A | | 7/1989 | Slutz .......................... 228/121 |
| 4,931,363 A | | 6/1990 | Slutz et al. .................. 428/408 |
| 4,944,772 A | | 7/1990 | Cho ............................ 51/293 |
| 4,960,643 A | * | 10/1990 | Lemelson |
| 5,037,704 A | | 8/1991 | Nakai et al. ................. 428/550 |
| 5,173,091 A | | 12/1992 | Marek .......................... 51/295 |
| 5,215,942 A | * | 6/1993 | MacKenzie et al. |
| 5,431,800 A | * | 7/1995 | Kirchhoff et al. |
| 5,545,030 A | * | 8/1996 | Pinneo |
| 5,567,526 A | * | 10/1996 | Peters et al. |
| 5,609,955 A | | 3/1997 | Pinneo ........................ 428/323 |
| 5,614,140 A | | 3/1997 | Pinneo ........................ 264/81 |
| 5,618,625 A | * | 4/1997 | Okamura |
| 5,654,059 A | * | 8/1997 | Hecht |
| 5,783,316 A | | 7/1998 | Colella et al. .............. 428/660 |
| 5,844,252 A | | 12/1998 | Shiomi et al. ................. 257/10 |
| 5,910,471 A | * | 6/1999 | Christianson et al. |
| 5,921,856 A | * | 7/1999 | Zimmer |
| 6,171,691 B1 | | 1/2001 | Nishibayashi ............... 428/325 |
| 6,196,307 B1 | * | 3/2001 | Ozmat |
| 6,238,280 B1 | | 5/2001 | Ritt et al. .................... 451/540 |
| 6,261,469 B1 | * | 7/2001 | Zakhidov et al. |
| 6,263,250 B1 | | 7/2001 | Skinner ...................... 607/126 |
| 6,361,857 B1 | * | 3/2002 | Saito et al. |

FOREIGN PATENT DOCUMENTS

| | | | |
|---|---|---|---|
| EP | 0518631 | * | 12/1992 |
| JP | 04129622 | * | 4/1992 |
| JP | 05-320910 | * | 12/1993 |
| JP | 06-056585 | * | 3/1994 |

* cited by examiner

Primary Examiner—Archene Turner
(74) Attorney, Agent, or Firm—Sierra Patent Group, Ltd.

(57) ABSTRACT

A diamond foam article comprises diamond deposited material on a substrate having an open contiguous structure at least partially filled with a filler material. Methods for forming a diamond foam article comprise providing a foam substrate; preparing the foam substrate for diamond deposition; depositing diamond material on the foam substrate by one of several diamond deposition methods; and at least partially filling the diamond foam article with a filler material. Diamond foam articles are bonded to other components.

36 Claims, 10 Drawing Sheets

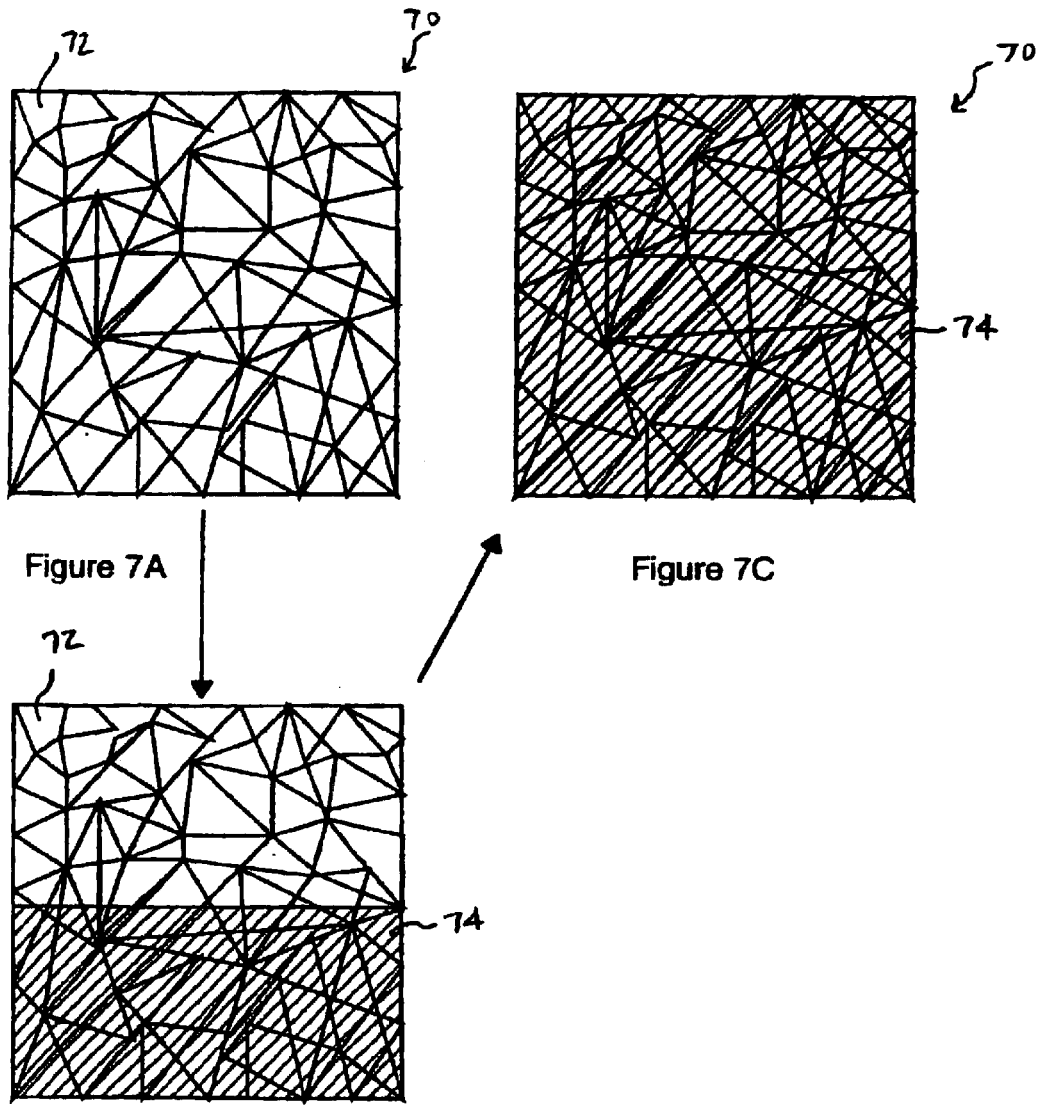
Partial and Complete Infiltration

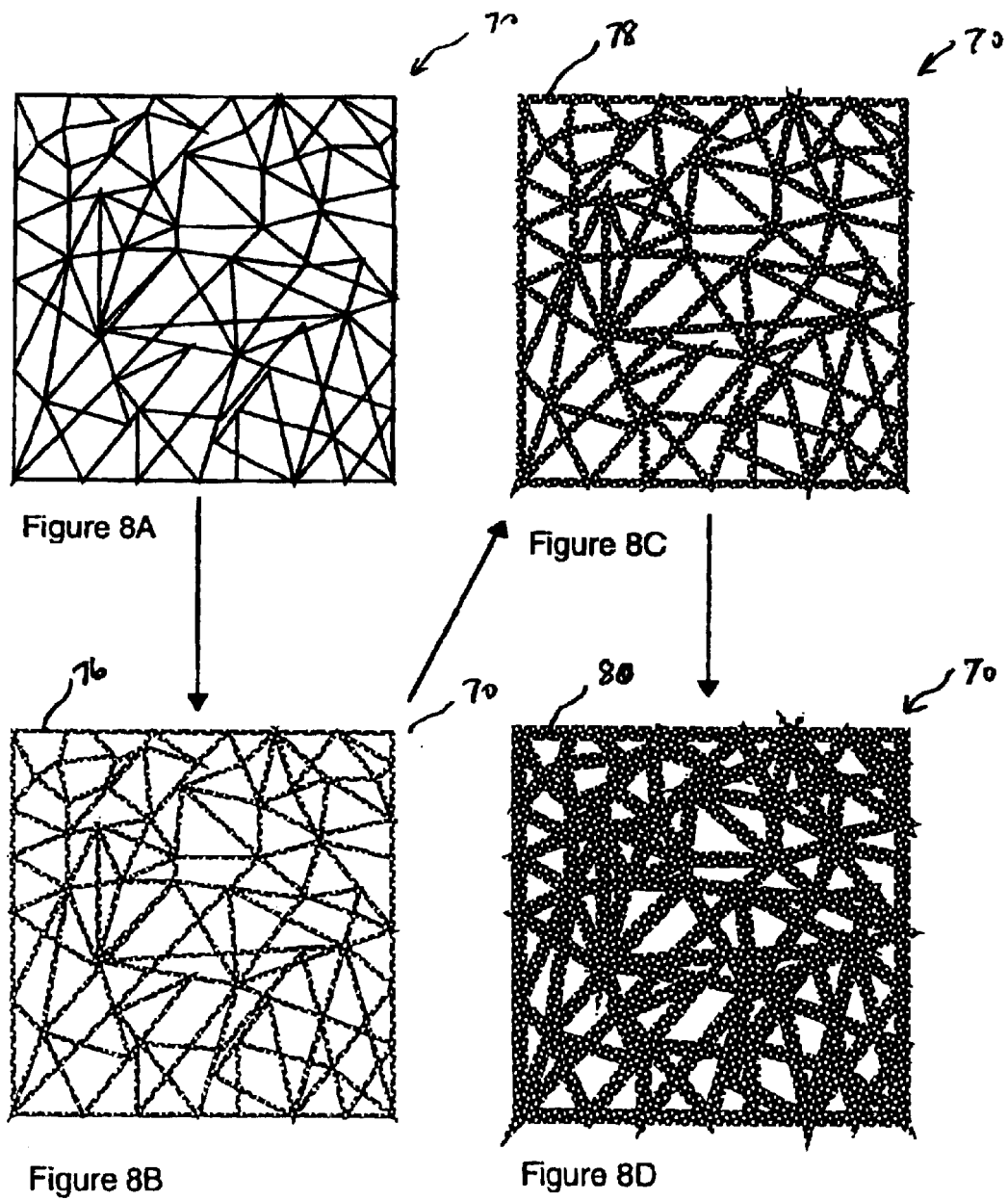
Dip Coating

Soldering Diamond Foam to Additional Materials

Joining Diamond Foam to Diamond Film
by Diamond Deposition

FILLED DIAMOND FOAM MATERIAL AND METHOD FOR FORMING SAME

BACKGROUND OF THE INVENTION

1. Field of the Invention

The present invention relates to a new type of material that employs diamond to enhance its physical properties. More specifically, the present invention relates to an open-cell reticulated structure coated into and throughout with a diamond material and at least partially filled with another material.

2. The Prior Art

There is a broad class of known materials classed as open-cell foams. These materials consist of reticulated structures through which fluids can flow. They resemble the intersections observed in a mass of bubbles, hence their description as "foam".

These materials can be fabricated by a variety of methods, and are available in various ceramics, metals, and carbon. These materials exhibit a three-dimensional reticulated unitary structure, which distinguishes them from other open-cell structures, such as stacked screens, comprising the mechanical juxtaposition of otherwise separate components.

These materials find a variety of uses in industry. For example, foams made of silicon carbide can be used to filter slag from molten aluminum. In other applications, fluid flows through a foam structure to carry away or supply heat. In this use, the inherent high surface area to volume ratio of the foam provides superior heat transport compared to planar heat exchangers.

Diamond/nondiamond composite materials formed by chemical vapor infiltration are also known in the art. Examples of such materials are found in U.S. Pat. No. 5,609,955 and U.S. Pat. No. 5,614,140. These materials are formed by consolidation of particulate substrate materials with diamond deposited through chemical vapor infiltration processes. These materials often contain residual porosity, or voids, that remain due to the blockage of diffusion channels that supply activated gas species to the interior. These voids degrade the material's bulk thermal conductivity and can act as stress concentrators to reduce breakage resistance. These residual porosities or voids are often closed off from the external environment and therefore cannot play any role in supporting fluid flow through the consolidated composite material.

These materials are distinct from the present invention in that they are formed by fusion of a multiplicity of separate particles into a single resultant structure, whereas the instant invention coats an existing unitary structure with diamond.

BRIEF DESCRIPTION OF THE INVENTION

The present invention is diamond foam, and methods for its manufacture, consisting of diamond deposited on a pre-existing framework, the framework being compatible with diamond deposition, and having an open-cell structure. Subsequent to diamond deposition, the diamond-coated framework is at least partially filled with, and/or coated with another material.

A method for forming a diamond foam according to the present invention comprises providing a substrate; preparing the substrate for diamond deposition; depositing diamond or doped diamond material on the substrate; followed by partial or complete infiltration and/or coating of the diamond material with another material. According to the present invention, the diamond material can be deposited on the substrate by one of several diamond deposition methods.

BRIEF DESCRIPTION OF THE DRAWING FIGURES

FIGS. 7A, 7B and 7C are diagrams illustrating both partially and completely infiltrated diamond foam materials according to the present invention.

FIGS. 8A through 8D are diagrams illustrating a process for dip coating diamond foam materials according to the present invention.

FIGS. 9A through 9C are diagrams illustrating a process for soldering diamond foam materials to other materials according to the present invention.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1A:
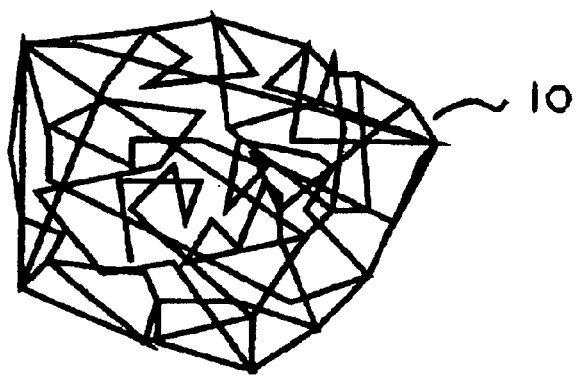
FIGS. 1A and 1B are, respectively, schematic perspective views of an uncoated substrate framework material and a diamond foam article according to the present invention.
Figure 1B:
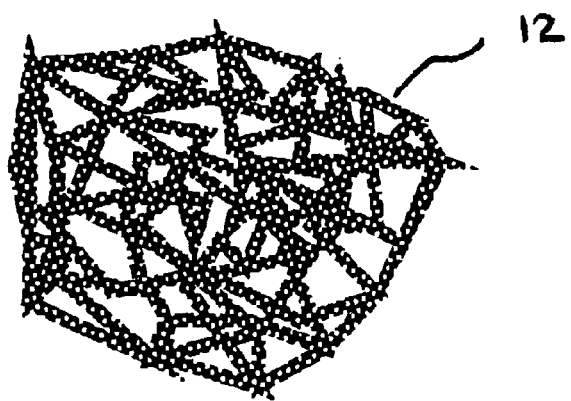

Referring first to FIGS. 1A and 1B, simplified diagrams illustrate a framework 10 upon which a diamond layer is formed according to the present invention to produce a diamond foam article 12. An uncoated framework material 10 shown in FIG. 1A forms a substrate for the diamond foam articles of the present invention. Materials composing the substrate framework on which diamond is to be grown comprise those materials known to be suitable hosts for diamond deposition, including without limitation, molybdenum, tungsten, silicon nitride, silicon carbide, boron carbide, and boron nitride and mixtures thereof. Substrate network materials may also consist of materials that are not suitable for diamond deposition, so long as they are coated with an interlayer that is compatible with diamond deposition. An example is the use of steel foam network material overcoated prior to diamond deposition with a thin layer of titanium, which is known to the art to enable diamond deposition on steel, which, without an interlayer such as titanium, will not permit formation of adherent diamond coatings. A non-limiting example of a commercially-available substrate material is a silicon carbide foam substrate material such as DuoCell/SiC, nominal 25 pores/inch, available from ERG Materials and Aerospace Corporation of Oakland, Calif.

With regard to the operability of the diamond foam articles of the present invention over a range of foam porosities and void size distributions, it is operable at the small end of foam porosity until either the interstices within the coated framework become so small as to preclude formation of the necessary plasma layer on its surfaces, and/or the resistance to gas flow becomes so large as to preclude the transport of reactant gases to the desired deposition sites, precluding diamond deposition. In practice, these effects will occur at porosity sizes that will vary at least as functions of gas pressure, plasma excitation frequency and power, and foam substrate network temperature, as well as other parameters particular to each individual deposition apparatus. The present invention is operative to open-cell foams with average void size distributions at least as small as 100/inch. In the limit for large foam porosities, the invention is operative until porosities become so large as to render the material mechanically unstable, and therefore useless for applications, or until so much diamond would have to be deposited to impart useful properties as to be economically impractical. The present invention is operative for open-cell foam substrate materials with a void size distribution at least as large as one every 2 inches.

In most applications of the present invention, it will be desirable to apply sufficient diamond to the substrate network material to produce a fully coalesced coating, with no holes or other imperfections in the diamond that might compromise the integrity of the underlying network substrate material or impair achieving the properties it is desired to achieve through application of the diamond coating. The present invention contemplates a minimum diamond coating thickness of approximately 2 micrometers to provide a fully coalesced coating. As is understood by those of ordinary skill in the art of diamond deposition, the minimum coating thickness required to achieve an absence of coating defects may vary substantially according to the particulars of the substrate network material, the preparation of said material for coating with diamond, and/or the diamond coating technology selected.

Figure 2A:
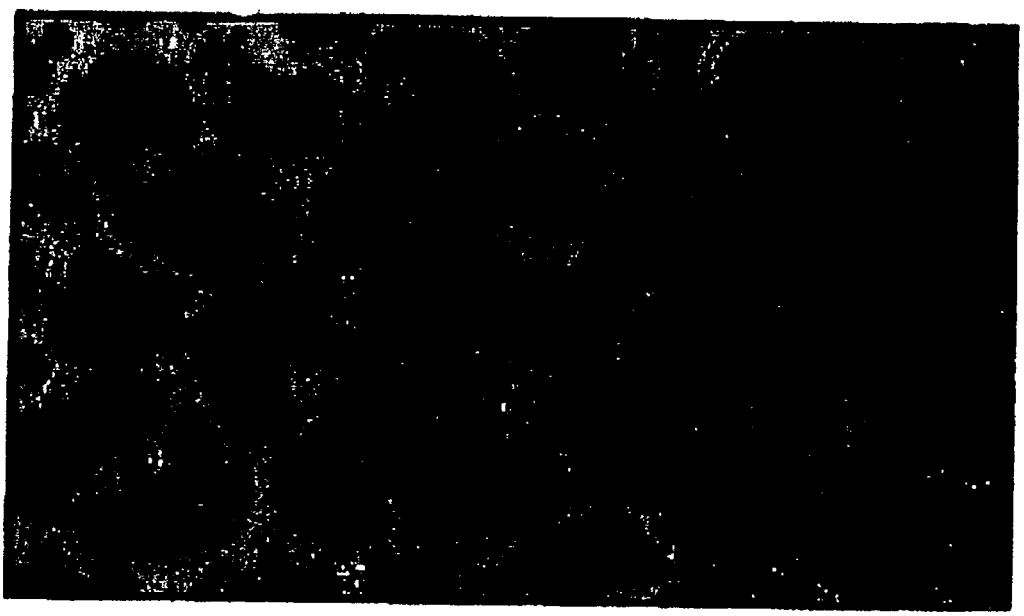
FIGS. 2A and 2B are microphotographs which respectively show a silicon carbide foam substrate framework material prior to, and after, diamond deposition to form a diamond foam article according to the present invention.
Figure 2B:
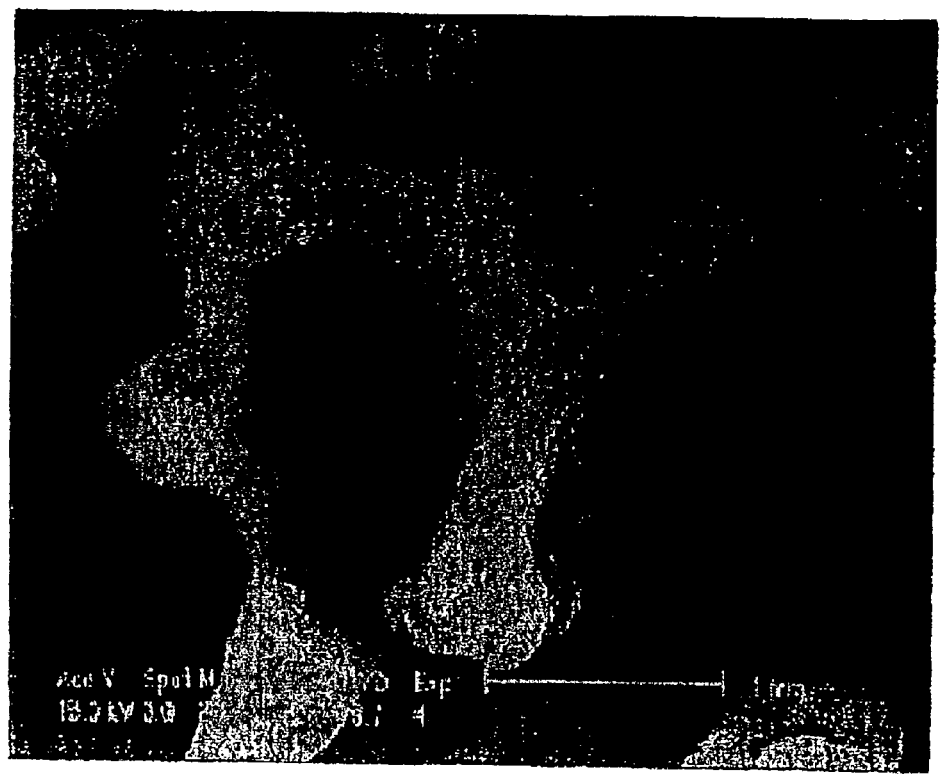

As will be appreciated by persons of ordinary skill in the art, the three-dimensional shape of finished diamond foam articles according to the present invention may be determined by providing a framework substrate 10 having a desired geometry. As illustrated in FIG. 1A, the framework substrate 10 is an open-celled structure having little or no regularity or periodicity. An open-celled structure allows for the flow of fluid (e.g., liquids, gases, fine particulates. etc.) through the structure. Diamond is deposited on the open-celled framework substrate 10 such that the diamond coats all exposed surfaces of the framework substrate 10, as illustrated in FIGS. 1B, 2A, and 2B. Following diamond deposition, the substrate material 10 is still an open-celled structure, as illustrated in FIG. 1B, allowing for the flow of fluid through the structure.

The framework 10 of FIG. 1A is coated with a layer of diamond material as taught herein to form diamond foam article 12 as illustrated in FIG. 1B. FIGS. 2A and 2B, respectively, are microphotographs which respectively show a silicon carbide foam substrate framework material prior to, and after, diamond deposition to form a diamond foam article according to the present invention. More specifically, FIG. 2A shows the structure of the substrate material 10 at a magnification of about 16× and FIG. 2B shows the structure of a completed diamond foam article 12 at a magnification of about 100×

According to the methods for forming diamond foam articles of the present invention, a suitable substrate framework material is exposed to diamond deposition through chemical vapor deposition (CVD) processes known to the art. Suitable diamond CVD methods include, but are not limited to, plasma-assisted CVD (including microwave, RF, and plasma torch variants), hot filament CVD, and combustion torch CVD. Diamond deposits on the surfaces of the exposed substrate framework at a rate that is determined by the particular deposition modality and process conditions employed. When the desired thickness of diamond has been achieved, the process is halted and the diamond foam material is removed from the deposition system.

The following examples are illustrative of processes which may be employed according to the present invention to form the diamond foam article according to the present invention.

Figure 3:
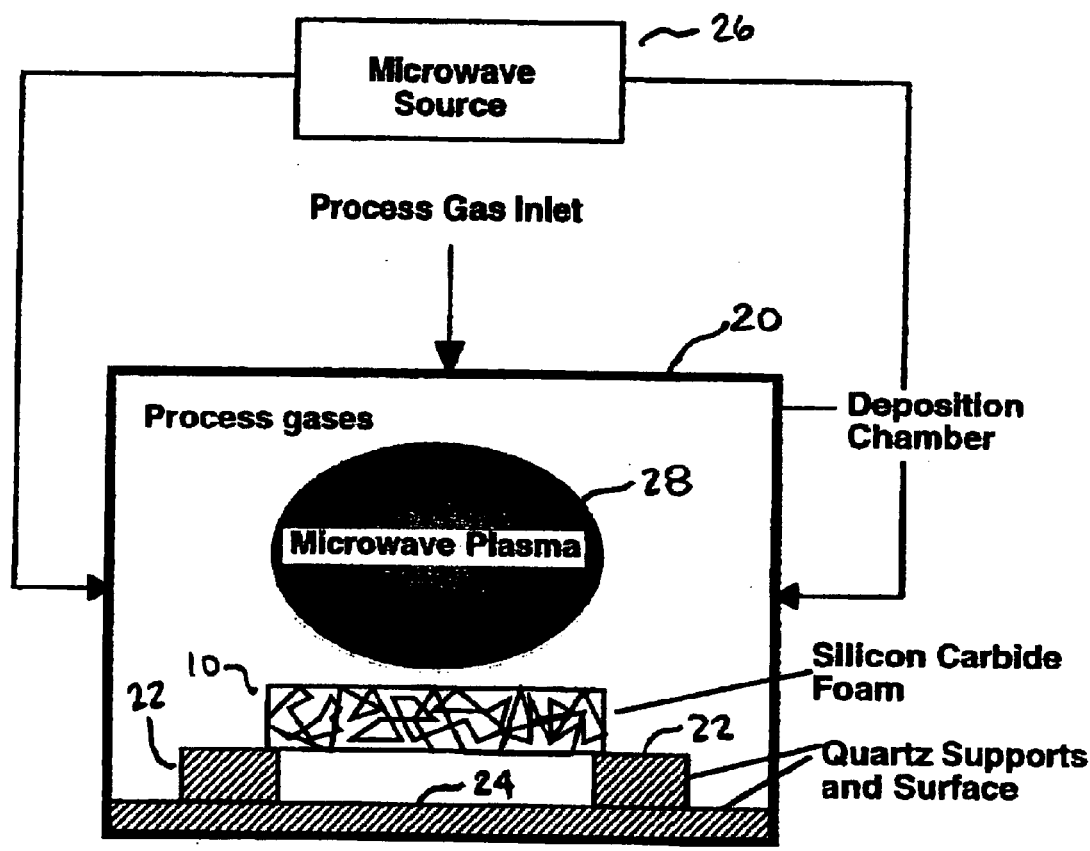
FIG. 3 is a diagram illustrating a first illustrative process for forming a diamond foam material according to the present invention.

Embodiment 1:

A first illustrative process for forming a diamond foam article according to the present invention is illustrated in FIG. 3. A silicon carbide foam substrate material 10 (DuoCell/SiC, nominal 25 pores/inch, from ERG Materials and Aerospace Corporation of Oakland, Calif.) having dimensions 1 inch×1 inch×0.25" thick, is washed for 10 minutes with mild agitation in a solution of isopropyl alcohol containing 10 grams/liter of 0.1 micron diamond dust to induce rapid diamond nucleation and growth in a manner known to the art. The silicon carbide foam is removed from the diamond dust/alcohol slurry and allowed to dry.

As shown in FIG. 3, the dried silicon carbide foam is then placed in a reactor 20 suitable for diamond deposition using microwave-assisted plasma technology well-known to the art. The foam is supported on quartz supports 22 with one of its broad faces parallel to, and 1 centimeter above, a quartz surface 24, as shown in FIG. 2. The chamber is closed and evacuated. A process gas consisting of a mixture of 98 parts hydrogen and 2 parts methane by volume is admitted to the chamber. Microwave power is applied to the chamber 20 from microwave source 26 such that a region of ionization, or plasma 28, is formed. The position of the foam substrate material 10 is adjusted with respect to the plasma excitation zone such that the plasma 28 impinges on its upper surface. In the instant reactor, microwave energy is supplied at 915 MHz and at a power level ranging from 2 kW to 5 kW. Gas pressure is controllable between 1 and 200 Torr, and gas flow rates are variable between 1 and 1000 sccm for all gases. Microwave power and process gas pressure are adjusted such that the upper surface temperature of the foam, as measured by noninvasive infrared optical methods known to persons of ordinary skill in the art, lies between 650 degrees Centigrade and 900 degrees Centigrade, to permit the deposition of high quality diamond. Deposition is continued for a period of 24 hours, after which the diamond-coated foam is removed from the chamber. The silicon carbide foam substrate network is found to be coated throughout its volume with diamond ranging in thickness from approximately 100 microns on the upper surface to approximately 50 microns on the lower surface.

Figure 4:
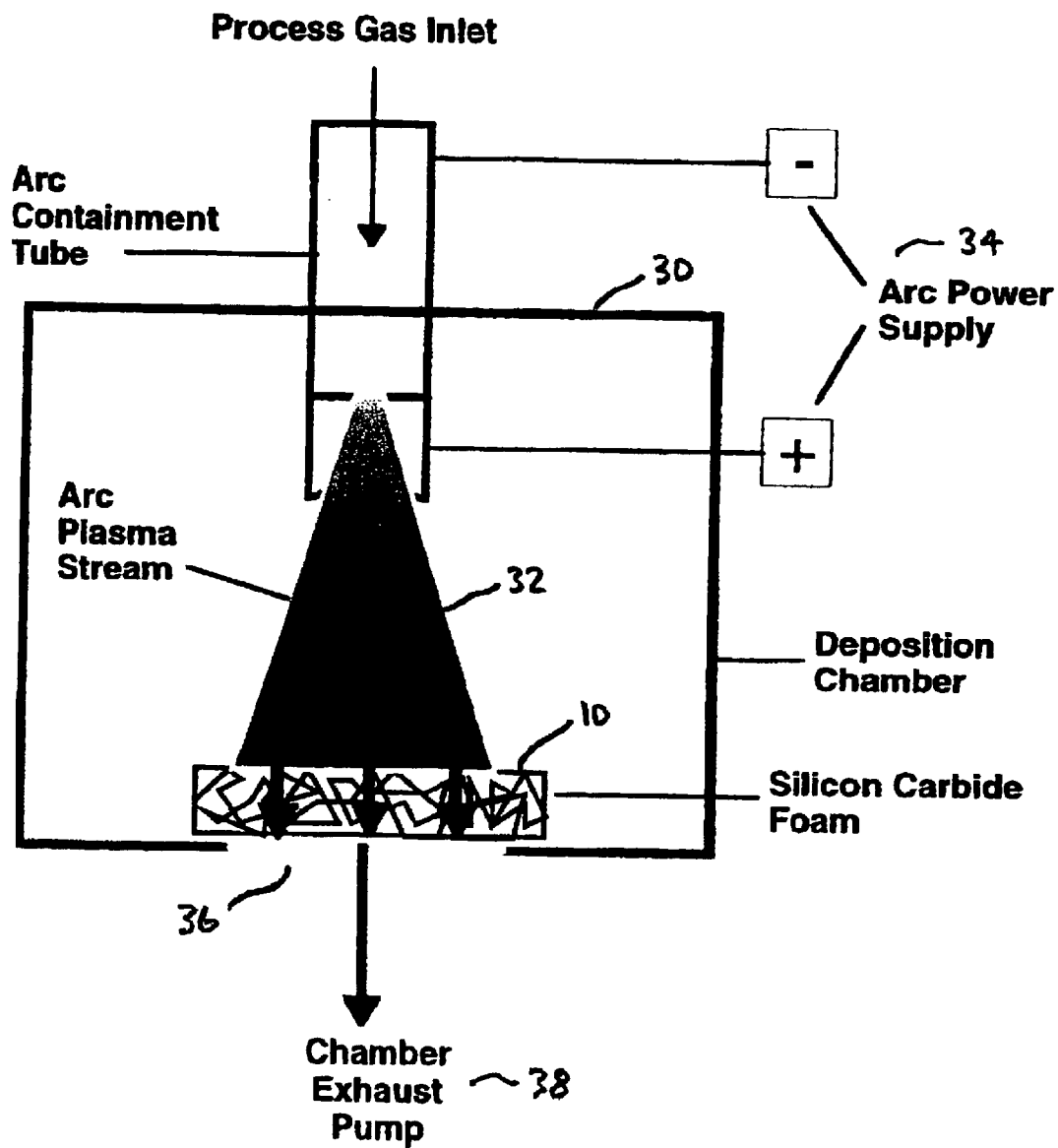
FIG. 4 is a diagram illustrating a second illustrative process for forming a diamond foam material according to the present invention.

Embodiment 2:

A second illustrative process for forming a diamond foam article according to the present invention is illustrated in FIG. 4. A silicon carbide foam substrate material 10 (DuoCell/SiC, nominal 25 pores/inch, from ERG Materials and Aerospace Corporation of Oakland, Calif.) having dimensions 1 inch×1 inch×0.25" thick, is washed for 10 minutes with mild agitation in a solution of isopropyl alcohol containing 10 grams/liter of 0.1 micron diamond dust to induce rapid diamond nucleation and growth in a manner known to the art. The silicon carbide foam material 10 is removed from the diamond dust/alcohol slurry and allowed to dry.

The dried silicon carbide foam material 10 is then placed in a reactor 30 suitable for diamond deposition using electrical torch plasma-assisted technology well-known to the art. The deposition chamber 30 is evacuated, and process gases in a mixture of 97 parts hydrogen to 3 parts methane by volume are admitted to the chamber 30. The silicon carbide foam material 10 is supported so as to allow a plasma torch gas stream 32 ignited by arc power supply 34 to impinge on the first broad face of the foam material 10, while its opposing broad face is disposed immediately adjacent to the exhaust port 36 through which process gases flow from the chamber 30 to the exhaust pump 38, effectively causing the energized plasma gases to flow through the porous silicon carbide foam material 10, as shown in FIG. 4.

Torch electrical power, gas flow rate, and chamber pressure are adjusted to maintain the first (impingement) surface of the silicon carbide foam between 650 degrees Centigrade and 900 degrees Centigrade, to permit the deposition of high quality diamond. Deposition is continued for a period of 5 hours, after which the diamond-coated foam is removed from the chamber 30. The silicon carbide foam substrate network is found to be coated throughout its volume with diamond ranging in thickness from approximately 150 microns on its upper surface upon which the plasma impinged, to approximately 100 microns on its lower surface through which gases exited the deposition chamber.

Figure 5:
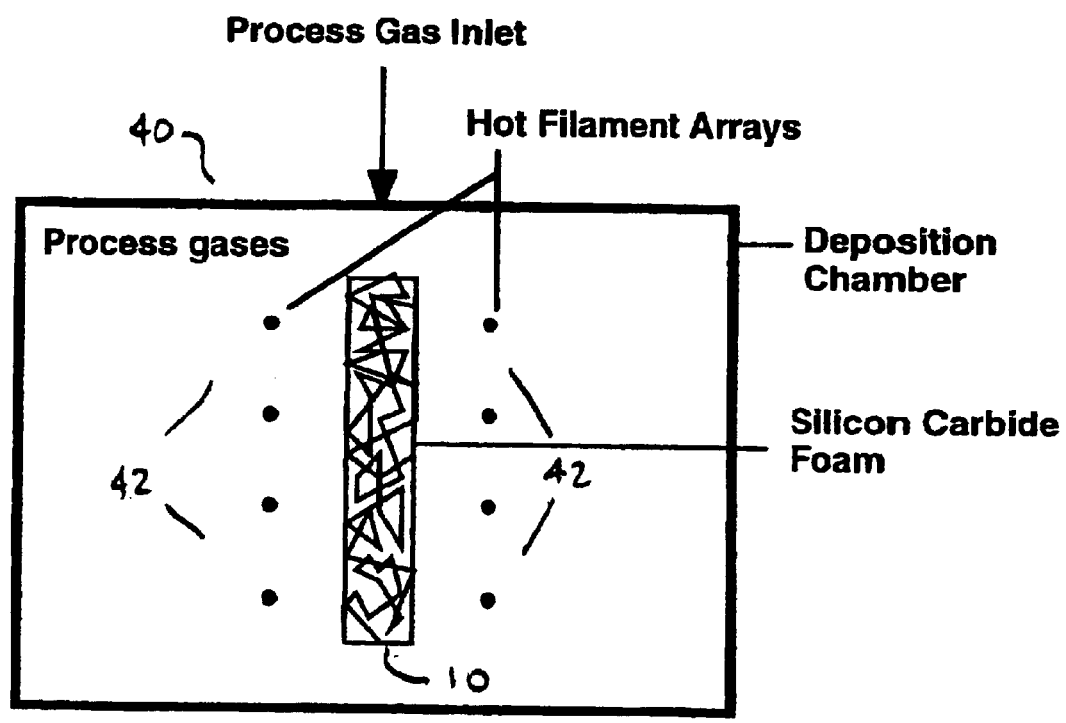
FIG. 5 is a diagram illustrating a third illustrative process for forming a diamond foam material according to the present invention.

Embodiment 3:

A third illustrative process for forming a diamond foam article according to the present invention is illustrated in FIG. 5. A silicon carbide foam material 10 is prepared as in the foregoing embodiments. The silicon carbide foam material 10 is placed in a chamber 40 suitable for diamond deposition using the hot filament technology well-known to the art. The silicon carbide foam material 10 is mounted between two arrays 42 of tantalum filaments such that each broad face lies approximately 1 centimeter from its opposed filament array 42 and parallel thereto, as shown in FIG. 4. The deposition chamber 40 is exhausted, and a deposition gas mixture consisting of 98.5 parts hydrogen and 1.5 parts methane by volume is admitted to the chamber 40. Electrical power is applied to the filament arrays 42, heating them to a temperature of 2,100 degrees Centigrade. Pressure in chamber 40 is adjusted to 30 Torr. The silicon carbide foam material 10 is found to exhibit a temperature of approximately 825 degrees Centigrade. Diamond deposition is continued for a period of 24 hours. The silicon carbide foam substrate network 10 is found to be coated throughout its volume with diamond ranging in thickness from approximately 40 microns on one surface opposed to one filament array, to approximately 40 microns on the other surface opposed to the other filament array.

Figure 6:
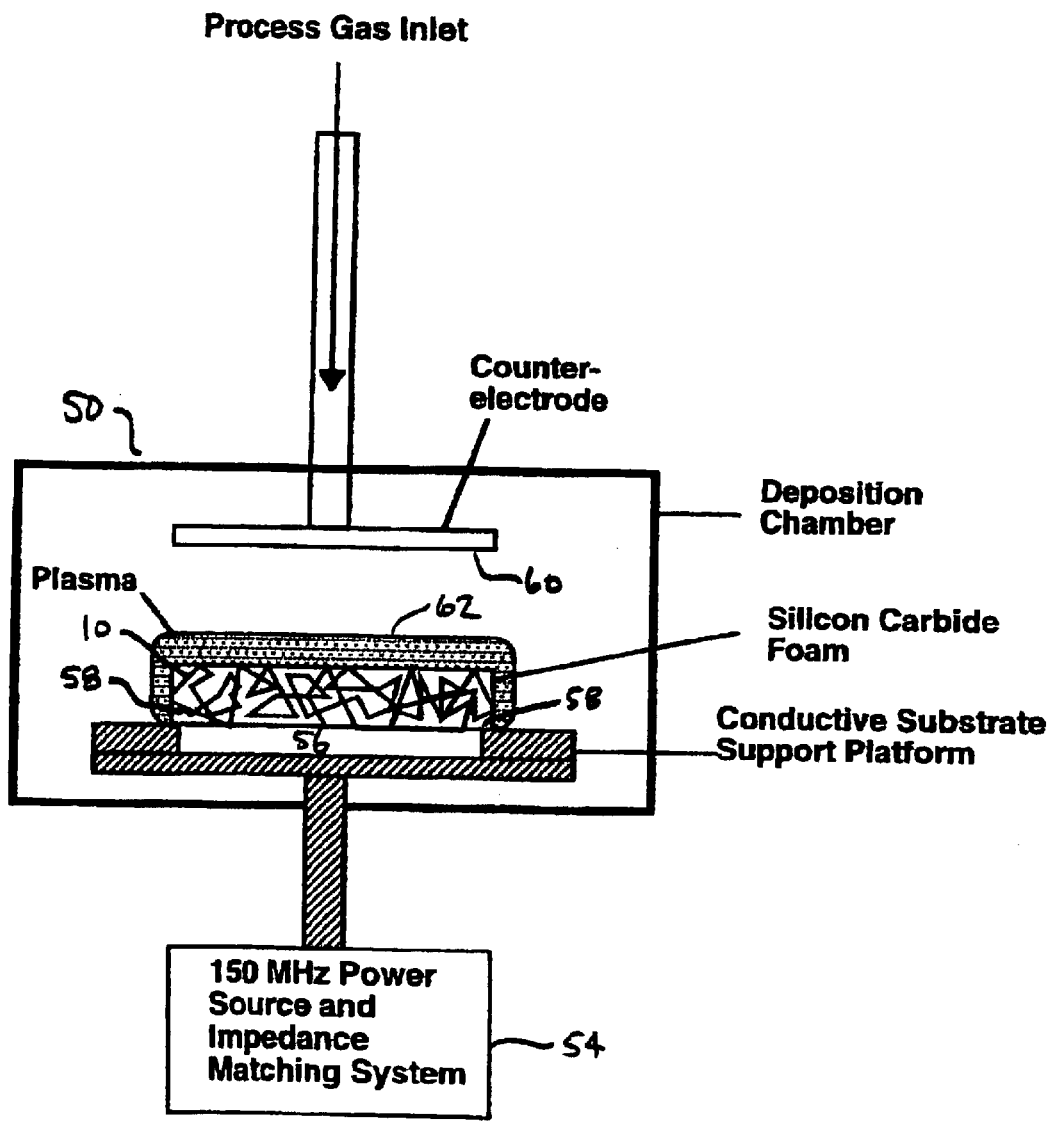
FIG. 6 is a diagram illustrating a fourth illustrative process for forming a diamond foam material according to the present invention.

Embodiment 4:

A fourth illustrative process for forming a diamond foam article according to the present invention is illustrated in FIG. 6. A silicon carbide foam material 10 is prepared as in the foregoing embodiments. The foam material 10 is placed in a chamber 50 suitable for diamond deposition using radio-frequency energy known to those skilled in the art. The silicon carbide foam material is supported on an electrically conductive platform 52 that serves to couple radio-frequency energy from RF source 54 to the foam material 10, leaving a 1 centimeter space 56 between the foam surface adjacent to the substrate support platform 52 save for a small area 58 near the periphery of the foam that touches the substrate support platform 52 to provide electrical contact therewith. A counterelectrode 60 is provided adjacent to this platform to assist in igniting and maintaining a plasma 62, as shown in FIG. 5. RF source 54 introduces radio frequency energy into the deposition chamber, with due regard for the need to achieve gas isolation and good electrical impedance matching as is known in the art.

The chamber 50 is sealed and exhausted. Deposition gases, consisting of 97 parts hydrogen and 3 parts by volume of methane are admitted to the chamber 50. Radio frequency energy at 150 MHz is applied to the electrically conductive foam support 52, and a plasma 62 is observed to light in a configuration that conforms closely to the surface of the foam material 10 and its subjacent support platform 52. Radio frequency power and gas pressure are increased until the temperature of the foam material 10 is within the range of 650 degrees Centigrade to 900 degrees Centigrade.

Deposition is continued for 5 hours, and is then terminated. On removal from the chamber 50, the silicon carbide foam material 10 is found to have been coated with approximately 75 microns of diamond on the surface facing the counterelectrode 60 and with approximately 50 microns of diamond on the surface facing the substrate support platform 52.

It will be apparent to those skilled in the art that the above process conditions are recited by way of illustration, not limitation, the particulars of process conditions for deposition of diamond being determined by variations among specific diamond deposition systems. The recitation of silicon carbide foam in a planar, prismatic configuration as a substrate material is not by way of exclusion of nonplanar open cell substrates, such as spheres, cones, cups, tubes, cylinders, or other geometries or substrate materials from the practice of this invention. Recitation of reticulated foam structures having substantially random distribution of voids as substrates for preparation of diamond foam materials is not by way of exclusion of structures having voids that are disposed in more regular or repeating fashion.

According to a first embodiment of the present invention both partially and completely infiltrated diamond foam materials are provided. This embodiment of the invention is illustrated in FIGS. 7A and 7B, diagrams illustrating that a diamond foam 70 formed according to the methods disclosed herein may have its voids (an illustrative one of which is identified at reference numeral 72) partially or completely filled with non-diamond material 74 in order to impart additional useful properties to the diamond foam.

There are two types of infiltration of diamond foam contemplated by this invention. In one type, illustrated in FIGS. 7B and 7C, all of the void volume within a selected region of the diamond foam material 70 is filled with another material 74. The region selected for this infiltration may consist of any proportion of the diamond foam volume up to 100%. FIG. 7B illustrates a diamond foam material 70 having approximately 50% infiltration and FIG. 7C illustrates a diamond foam material 70 having approximately 100% infiltration. This mode of infiltration may be accomplished by flooding the selected diamond foam volume with the infiltration material 74 and effecting its fixation by drying, curing, cooling, or other known methods.

In the second type of infiltration, illustrated in FIGS. 8A through 8C, all voids in a selected volume of diamond foam material are partially filled. The selected volume may range up to 100% of the volume of the diamond foam material being infiltrated, and the degree of infiltration within that volume may be any degree less than full, or 100%, infiltration. An illustrative method for achieving this mode of infiltration is through repetitive dipping of the diamond foam, interspersed with drying or other type of fixation between dip cycles.

Filler materials may impart strength and toughness to the filled foam, modify its electrical or chemical characteristics, or change its optical parameters. Nonexhaustive examples of filler materials include organic materials such as epoxy adhesive or methacrylate, and inorganic ceramic materials such as silicon carbide slurry, magnetic materials such as ferrite powder slurry, magnetite powder slurry, or a Schiff base slurry, or metallic materials such as iron. As an example, the foam may be filled with plastics such as epoxies to impart additional strength or toughness. This process, called infiltration, may be accomplished by several different processes.

For example, as shown in FIGS. 8A and 8B, a diamond foam artifact (FIG. 8A) is submerged in a fluid that either is, or carries, material which it is desired to coat onto the diamond foam. The submergence may be carried out in ambient atmosphere, a special atmosphere, or in the absence of atmosphere, as required by the materials being utilized. After sufficient time has passed to allow the infiltration fluid to fill the diamond foam void volume to the extent desired, the diamond foam is withdrawn, and excess infiltrate is allowed to drain away. The diamond foam, coated with a thin layer 76 of the infiltrate material as shown in FIG. 8B, may be allowed to dry, may be heated, exposed to radiation, or otherwise treated to cause the layer of infiltrate material to dry, harden, cure, or otherwise form a robust, adherent coating over the diamond foam. Subsequent to this, as illustrated in FIGS. 8C through 8D, the submergence cycle may be repeated if it is desired to increase the coating thickness over the diamond foam. FIG. 8C shows the diamond foam material 70 coated with a thicker layer 78 of infiltrate material and FIG. 8D shows the diamond foam material 70 coated with yet a thicker layer 80 of infiltrate material. This process may be repeated until the desired thickness is achieved, or until the diamond foam voids become blocked due to accretion of infiltrate material. This process may be termed dip-coating.

One specific example of infiltrating a diamond foam according to the present invention comprises placing the foam volume to be infiltrated in a vacuum chamber from which may be removed at least 99% of the air normally contained within that chamber. The material to be infiltrated into the diamond foam is then admitted into the chamber and into the voids in the diamond-coated article. The chamber also includes apparatus or other means for acting upon the infiltration material, for example temperature control, ultraviolet light or an electron source for in-situ polymerization or curing, if desired. The chamber may also incorporate gas sources to support additional process requirements. After the diamond foam is properly placed within the chamber, the chamber is sealed and its atmosphere is exhausted. Time is allowed for the diamond foam to be heated or cooled as required by process parameters, after which the infiltration material is admitted to the chamber and allowed to submerge the diamond foam material to the extent desired. After the infiltration process is complete, and following any remaining process steps, and after the infiltrated diamond foam material has equilibrated with room temperature, air is readmitted to the chamber and the chamber is opened to recover the infiltrated material.

It will be apparent to those skilled in the art that the above teaching may be modified to infiltrate only a portion of the diamond foam, if desired, by limiting the amount of infiltration material admitted to the chamber such that there is not enough material to infiltrate the entire diamond foam void volume.

Certain properties of the diamond foam may be modified during manufacture by doping, i.e., incorporating small amounts of non-diamond material to the diamond during the growth process. Diamond may be doped with several non-diamond materials, among them, boron, nitrogen, phosphorus, lithium, arsenic, silicon, carbon, and sulfur. These dopant materials effect changes in the electrical, mechanical, and optical properties of the diamond that may be of great utility for certain applications.

According to one embodiment of the present invention, boron is added to the precursor atmosphere during diamond growth by admitting diborane gas to the deposition chamber along with the remainder of the deposition precursor gases, which are most often hydrogen and methane. The concentration of diborane to be admitted is determined by the desired electrical properties of the diamond. A typical range of diborane to be used is from 0.000001 to 0.0001 parts of diborane to hydrogen, by volume. The degree of boron incorporation into the grown diamond material will vary according to the type of diamond CVD technology employed and according to the particular process parameters required. An exemplary use of this material is as aircraft structural material for low observability requirements. Furthermore, the material's high thermal conductivity allows its temperature profile to be controlled so as to minimize its infrared signature, further enhancing its low observability characteristics.

In a similar manner, nitrogen may be incorporated as a dopant by admitting ammonia to the diamond growth atmosphere. Likewise, silicon may be incorporated as a dopant by admitting silane to the diamond growth atmosphere. These materials may be used alone or in combination to provide mixed dopants, or in sequence to provide layered doping in the diamond foam.

According to another embodiment of the present invention, doped diamond foam may be realized by depositing the diamond onto a reticulated substrate material selected to provide dopant species during the deposition process. For example, if boron doped diamond foam is desired, a substrate network of, or containing, boron carbide may be employed. During diamond deposition, a small portion of boron carbide is decomposed to yield elemental boron, which may then be converted to boron hydrides such as diborane and thereby made available for incorporation in the growing diamond foam.

In another embodiment of the present invention, a diamond foam may be usefully employed as a stable, inert substrate for exposure of catalytic materials to chemicals upon which it is desired to have said catalytic materials act. Non-exhaustive examples of catalytic materials include palladium, zeolites, alcohol dehydrogenase or other enzymes, thyrotropin or other hormones, cystein or other amino acids, albumin or other proteins, adenine or other nucleic acids, a sequence of deoxyribonucleic acid and one strand comprising the amino acid sequence A-T-C or other deoxyribonucleic acid sequence, or a sequence of ribonucleic acid consisting of the sequence U-U-A or other ribonucleic acid, antibodies, titanium dioxide, and the platinum group elements and alloys thereof. Diamond foam may be imbued with catalytic activity by coating the foam with a layer of catalytic material to a thickness of at least about 0.5 microns by methods similar to those taught to effect partial infiltration of diamond foam, modified as needed for the particulars of the chosen catalyst. For example, diamond foam may be coated with platinum, a widely used catalyst, by dip-coating the diamond foam into a liquid organoplatinum material such as those used in the manufacture of pyrolytic metallic inks known in the art. Upon appropriate drying of the coating, the diamond foam is subjected to heat (with due care taken to avoid exposure of the diamond foam to oxidizing atmospheres at temperatures greater than 500 degrees Celsius) sufficient to convert the dried organoplatinum coating to metallic platinum.

From the teachings herein, it will be apparent to those skilled in the art that a wide variety of catalytic agents, including enzymes, can be fixed to the surface of diamond foam through a dip-coating process. Dip-coating is offered as an example, rather than a limitation. Other methods for coating diamond foam, such as permeation with vapors or electrostatic powder or mist coating, will suggest themselves to those skilled in the art.

An additional type of diamond foam material according to the present invention consists of a diamond foam component as taught herein affixed to another component through soldering, brazing, adhesive bonding, or other methods known to the art. In this manner, additional utility may be achieved for diamond foam materials according to the present invention.

Figure 9C:
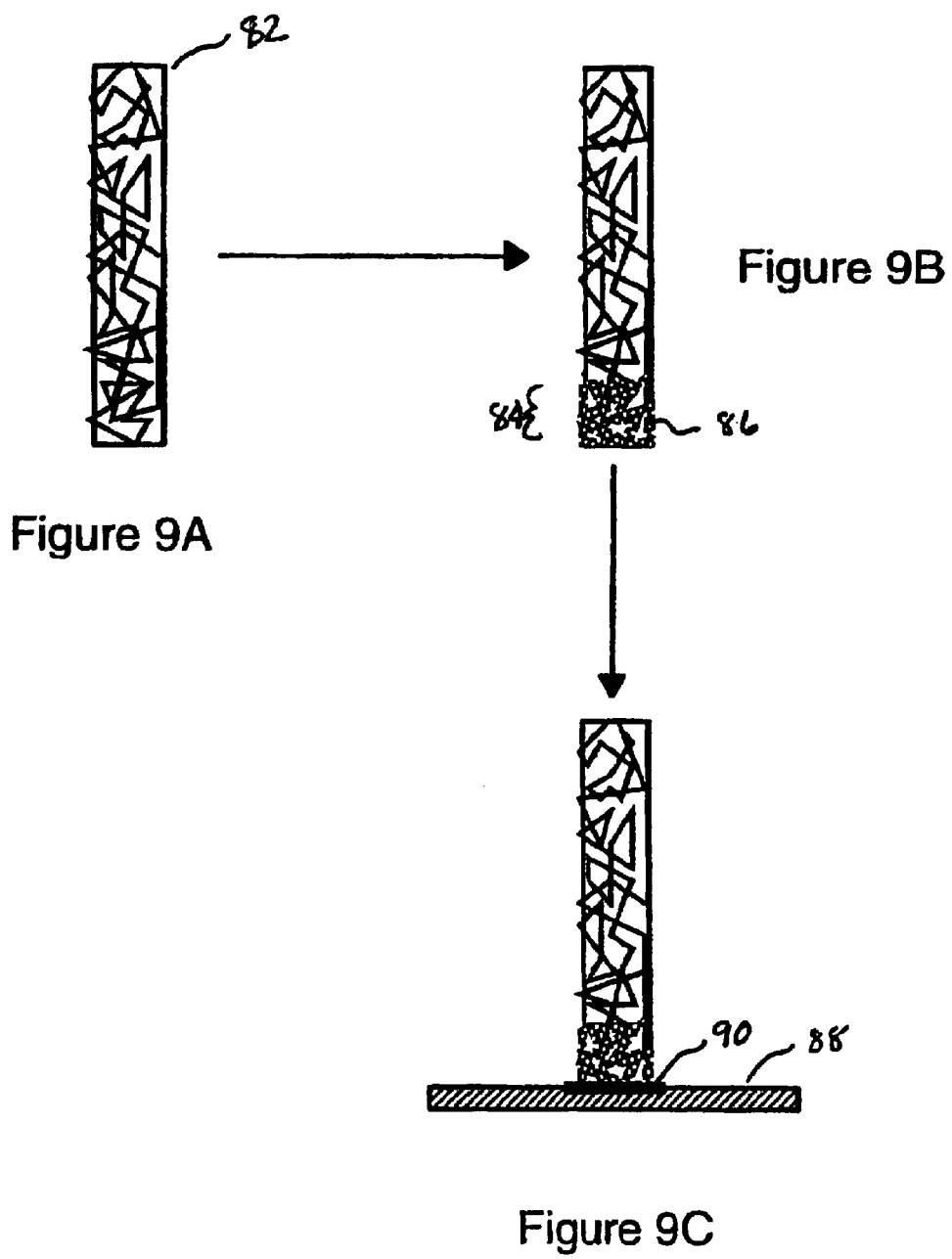

As illustrated in FIGS. 9A through 9C, diamond foam material 82 (FIG. 9A) may be prepared for soldering to another component as shown in FIG. 9B by coating the region of diamond foam 84 throughout which it is desired to obtain a solder bond with a series of metal coatings 86 to render the diamond foam capable of sustaining an adhesive solder bond. Many such series of metals are known to the art, and one is offered here by way of example, not limitation. A first layer of titanium of approximate thickness 200 Angstroms is applied using well-known sputtering or evaporation deposition technology, said titanium layer being followed by a platinum layer of approximate thickness 500 Angstroms similarly applied, followed by a final layer of gold of approximate thickness 1.5 micrometers, applied by either of the aforementioned processes, or by electroplating processes well-known to the art. This sequence of metal layers renders the diamond foam capable of supporting a sound mechanical bond to other solderable components, such as copper components, through the use of common solders such as tin/lead alloys. It will be noted that a diamond foam so prepared will also support a sound mechanical bond with other components, said bond being achieved through use of brazing materials such as silver braze commonly used in the art. In the case of brazing, in which bond formation temperatures are generally higher than those required for soldering, it is necessary to exclude air from contact with the diamond foam during the formation of the braze bond to preclude oxidation of the diamond foam.

A diamond foam thus prepared for soldering or brazing as seen in FIG. 9B can thereafter be attached to a solderable or brazeable component 88, or a component not by itself capable of being soldered or brazed, but which maybe rendered suitable by the application of appropriate surface treatments or coatings. Such a brazed component is shown in FIG. 9C including braze layer 90.

For example, and not by way of limitation, numerous useful articles are contemplated as within the scope of the present invention. A diamond foam component may be soldered to a heat pipe surface thereby to accelerate the transport of heat into or out of the heat pipe component. It is further contemplated that a diamond foam component may be soldered or brazed to an electronic component thereby to assist in control of the electronic component's temperature and/or temperature profile.

A diamond foam component may be affixed to another component by adhesive bonding, such as by application of epoxy glue formulations to the diamond foam component and another component while said components are juxtaposed, according to methods well-known in the art. Diamond foam requires no surface preparation to support sound adhesive bonding using epoxy adhesives.

Figures 10A, 10B, 10C:
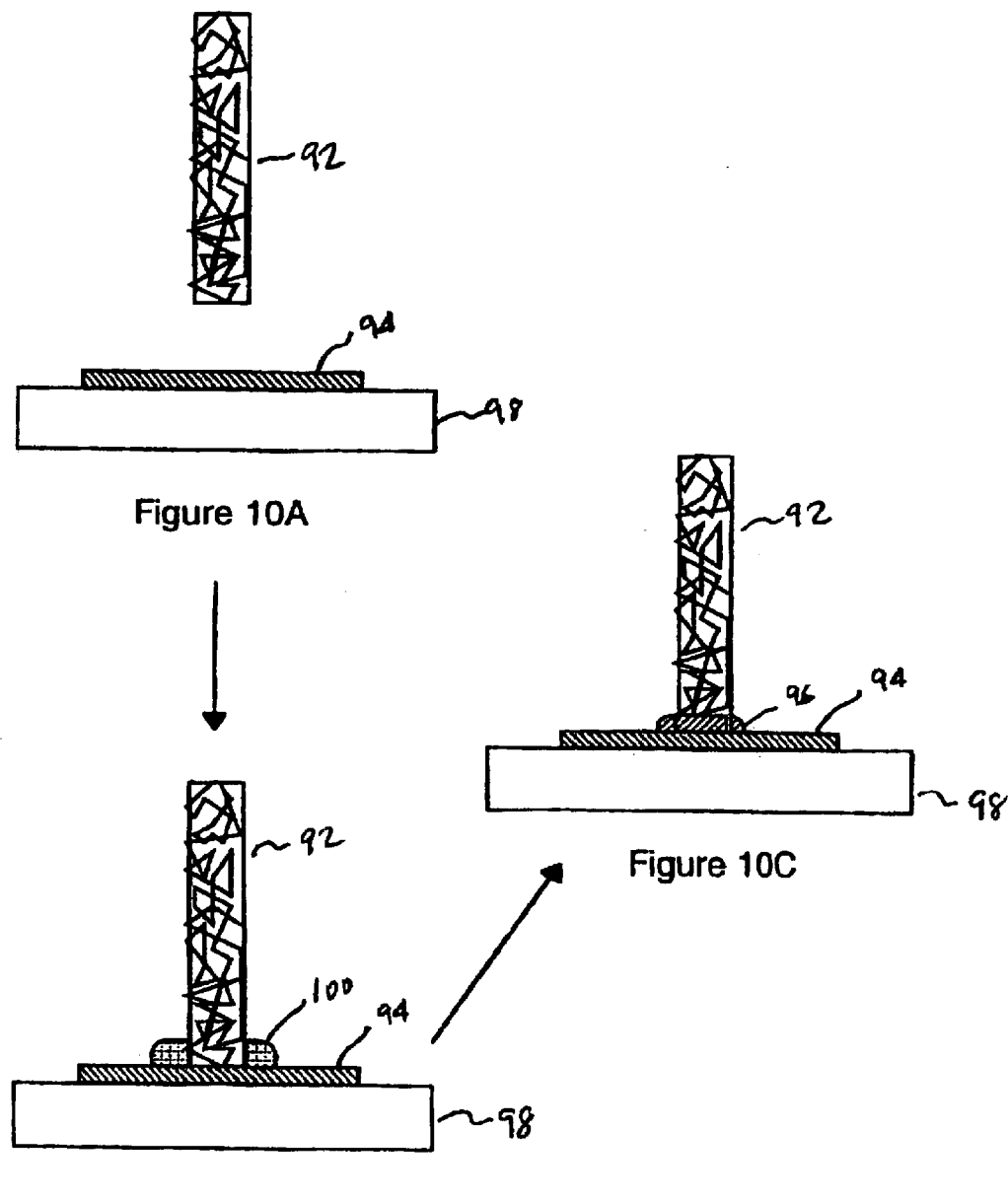
FIGS. 10A through 10C are diagrams illustrating a process for joining diamond foam materials to diamond films according to the present invention.

According to another aspect of the present invention illustrated with reference to FIGS. 10A through 10C, a diamond foam material 92 shown in FIG. 10A may be affixed to a component 94 made of diamond film through the deposition of additional diamond material 96 (shown in FIG. 10C) at a region of juxtaposition of the two components whose joining is intended. In the following example, which is not intended as limiting, a diamond foam component having approximate dimensions 2 inches×2 inches×0.25 inches is juxtaposed along one of its broad faces with one of the broad faces of a diamond film having approximate dimensions 2 inches×2 inches×0.5 millimeters. The juxtaposed assembly is placed into a chamber capable of diamond deposition and is placed on a support 98 that permits the formation of a plasma 100 (shown in FIG. 10B) in close proximity with the plane describing the juxtaposition of the diamond foam component 92 with the diamond film component 94. Appropriate process conditions well-known to the art are established to cause diamond 96 to be deposited at least at the juxtaposition plane, whereupon the diamond foam component 92 is fused to the diamond film component 94 through the growth of diamond 96 that mechanically overgrows both components, forming an intimate mechanical bond between the two components. After deposition of approximately 0.1 millimeter of diamond, the diamond foam component 92 is found to be effectively fused to the diamond film component 94, causing the two to form an integral structure.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An article comprising diamond deposited on an aperiodic open-celled ceramic framework material substrate, said framework material substrate at least partially filled with a filler material.

2. The article of claim 1 wherein said framework material substrate comprises a material compatible with a diamond deposition process.

3. The article of claim 1 wherein said framework material substrate comprises a material incompatible with a diamond deposition process coated with a material compatible with a diamond deposition process.

4. The article of claim 1 wherein said diamond has a thickness of at least about 2 microns.

5. The article of claim 1 wherein said diamond is fully coalesced.

6. The article of claim 1 wherein said filter material substantially completely fills voids in said framework material substrate.

7. The article of claim 1 wherein said filler material is chosen from the group including organic materials, inorganic ceramic materials, magnetic materials, and metallic materials.

8. An article comprising diamond doped with non-diamond material deposited on an aperiodic open-celled ceramic framework material substrate.

9. The article of claim 8 wherein said framework material substrate comprises a material compatible with a diamond deposition process.

10. The article of claim 8 wherein said framework material substrate comprises a material incompatible with a diamond deposition process coated with a material compatible with a diamond deposition process.

11. The article of claim 8 wherein said diamond doped with non-diamond material has a thickness of at least about 2 microns.

12. The article of claim 8 wherein said diamond doped with non-diamond material is fully coalesced.

13. The article of claim 8 wherein said article is at least partially filled with a filler material.

14. The article of claim 13 wherein said filler material substantially completely fills voids in said framework material substrate.

15. The article of claim 13 wherein said filler material is chosen from the group including organic materials, inorganic ceramic materials, magnetic materials, and metallic materials.

16. The article of claim 8 wherein said non-diamond material is at least one non-diamond material chosen from the group including phosphorus, lithium, arsenic, hydrogen, silicon, boron, carbon, sulfur and beryllium.

17. An article comprising diamond deposited on an aperiodic ceramic open-cell foam substrate, said open-cell foam substrate having voids therein, said voids at least partially filled with a filler material.

18. The article of claim 17 wherein said open-cell foam substrate comprises a material compatible with a diamond deposition process.

19. The article of claim 17 wherein said open-cell foam substrate comprises a material incompatible with a diamond deposition process coated with a material compatible with a diamond deposition process.

20. The article of claim 17 wherein said diamond has a thickness of at least about 2 microns.

21. The article of claim 17 wherein said diamond is fully coalesced.

22. The article of claim 17 wherein said filler material substantially completely fills said voids.

23. An article comprising diamond doped with non-diamond material deposited on an aperiodic ceramic open-cell foam substrate, said open-cell foam substrate having voids therein.

24. The article of claim 23 wherein said open-cell foam substrate comprises a material compatible with a diamond deposition process.

25. The article of claim 23 wherein said open-cell foam substrate comprises a material incompatible with a diamond deposition process coated with a material compatible with a diamond deposition process.

26. The article of claim 23 wherein said diamond doped with non-diamond material has a thickness of at least about 2 microns.

27. The article of claim 23 wherein said diamond doped with non-diamond material is fully coalesced.

28. The article of claim 23 wherein said voids are at least partially filled with a filler material.

29. The article of claim 28 wherein said filler material substantially completely fills said voids.

30. The article of claim 28 wherein said filler material is chosen from the group including organic materials, inorganic ceramic materials, magnetic materials, and metallic materials.

31. The article of claim 23 wherein said non-diamond material is at least one non-diamond material chosen from the group including phosphorus, lithium, arsenic, hydrogen, silicon, boron, carbon, sulfur and beryllium.

32. An article comprising diamond deposited on an aperiodic open-celled ceramic framework material substrate, said diamond at least partially coated with a catalytic material.

33. The article of claim 32 wherein said framework material substrate comprises a material compatible with a diamond deposition process.

34. The article of claim 32 wherein said framework material substrate comprises a material incompatible with a diamond deposition process coated with a material compatible with a diamond deposition process.

35. The article of claim 32 wherein said diamond has a thickness of at least about 2 microns.

36. The article of claim 32 wherein said catalytic material is chosen from the group including zeolites, enzymes, antibodies, titanium dioxide, and the platinum group elements and alloys thereof.

\* \* \* \* \*